United States Patent [19]

Tanigaki et al.

[11] Patent Number: 4,547,769
[45] Date of Patent: Oct. 15, 1985

[54] VACUUM MONITOR DEVICE AND METHOD FOR VACUUM INTERRUPTER

[75] Inventors: Shuzo Tanigaki, Tokyo; Tomio Yasuda, Kasukabe; Masayuki Sakaki, Numazu, all of Japan

[73] Assignee: Kabushiki Kaisha Meidensha, Tokyo, Japan

[21] Appl. No.: 437,678

[22] Filed: Oct. 29, 1982

[30] Foreign Application Priority Data

Oct. 30, 1981 [JP] Japan ............................. 56-173887
Oct. 30, 1981 [JP] Japan ............................. 56-173890
Jan. 29, 1982 [JP] Japan ............................. 57-12674

[51] Int. Cl.$^4$ ........................................... G08B 21/00
[52] U.S. Cl. ................................ 340/626; 340/605; 340/644
[58] Field of Search ............. 340/626, 644, 638, 639, 340/605, 660; 200/144 B; 361/2, 120

[56] References Cited

U.S. PATENT DOCUMENTS

| | | | |
|---|---|---|---|
| 3,090,207 | 5/1963 | Smith et al. | 62/3 |
| 3,403,297 | 9/1968 | Crouch | 361/115 |
| 3,594,754 | 7/1971 | Voshall | 340/605 |
| 3,882,380 | 5/1975 | Black | 324/60 C |
| 4,021,702 | 5/1977 | Rimmrott | 361/103 |
| 4,034,264 | 7/1977 | Muller et al. | 361/2 |
| 4,103,291 | 7/1978 | Howe et al. | 340/522 |
| 4,159,466 | 6/1979 | Darrel | 324/424 |
| 4,402,224 | 9/1983 | Fukushima | 340/626 X |
| 4,440,995 | 4/1984 | Lange et al. | 200/144 B |

FOREIGN PATENT DOCUMENTS 53-125881 11/1978 Japan .
54-147085 11/1979 Japan .

OTHER PUBLICATIONS

"Vacuum Techniques in Modern Circuit Breakers", Electronics & Power, Mar. 21, 1974, by T. V. Armstrong, and P. Headky, pp. 198–201.

Primary Examiner—James L. Rowland
Assistant Examiner—Jeffery A. Hofsass
Attorney, Agent, or Firm—Lowe, King, Price & Becker

[57] ABSTRACT

An abnormally high vacuum pressure of a vacuum interrupter is detected from outside of the interrupter in response to electromagnetic wave signals generated by an electric discharge derived in response to a voltage difference and depending upon Paschen's law. Since the above-mentioned electric discharge is quite different from so-called partial discharge, even when the fixed and movable contacts are closed (i.e., under hot-line condition), it is possible to detect poor vacuum pressure on the basis of the electric discharge existing between the fixed and movable contact rods including two contacts and the main shield, as well as when the two contacts are open. The vacuum monitor according to the present invention comprises a rod or loop antenna fixedly or movably disposed near a conductive material of or connected to the vacuum interrupter and a detection section including, in particular, a 2 to 20 KHz bandpass filter.

23 Claims, 13 Drawing Figures

OPENED CONTACTS

CLOSED CONTACTS

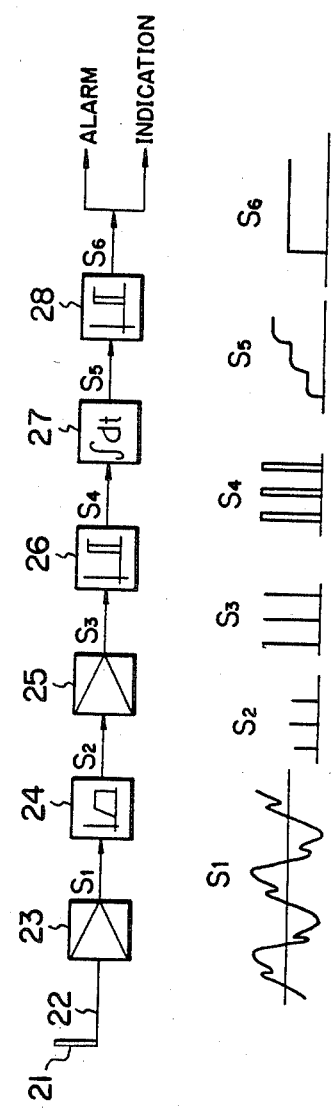

FIG. 4(A)
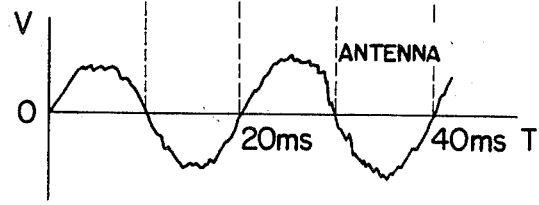
FIG. 4(B)
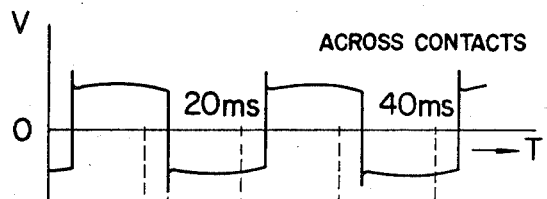
FIG. 5(A)
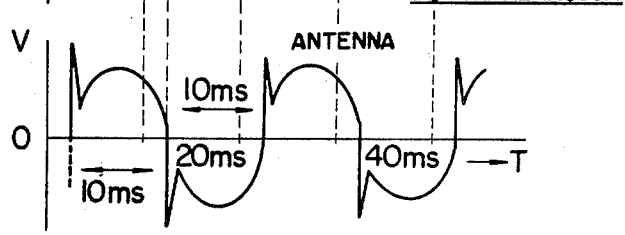
FIG. 5(B)

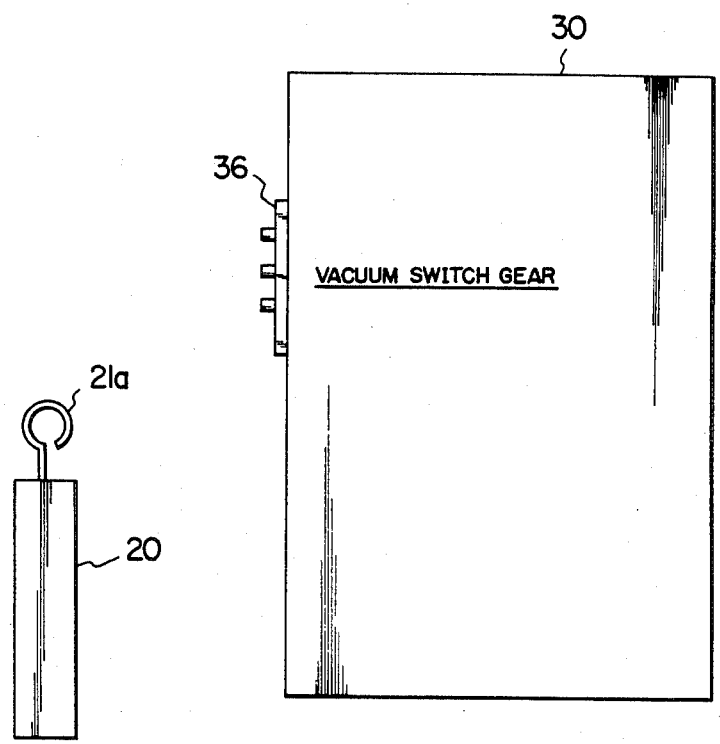

VACUUM MONITOR DEVICE AND METHOD FOR VACUUM INTERRUPTER

BACKGROUND OF THE INVENTION

1. Field of the Invention

The present invention relates generally to a vacuum monitor for detecting abnormally high vacuum pressure within a vacuum interrupter, and more specifically to a vacuum monitor for deriving an alarm or indicating a caution when vacuum pressure within a vacuum interrupter is abnormally increasing.

2. Description of the Prior Art

Generally, a vacuum interrupter for use with an electric power circuit has a normal circuit interruption performance when the vacuum pressure within an evacuated envelope of the interrupter is kept below $10^{-4}$ Torr (Torricelli). However, the vacuum pressure sometimes increases causing deterioration of circuit interruption performance. The pressure increases and interruption deterioration occur because of, for instance, outgassing from materials used for the interrupter or slow leakage of air (air leaks through cracks caused by undue mechanical stresses or through welded or insufficiently brazed junction portions). In case vacuum pressure increases abnormally within the evacuated envelope, the small contact spacing is no longer able to sustain a high voltage applied to the contacts; arcs and flashovers occur; a white hot arc burns the contact surfaces and may melt the vacuum envelope and other parts of the vacuum interrupter.

Therefore, in an electric power circuit, it is very important to check or monitor pressure within the vacuum interrupter while a vacuum interrupter is in operation; namely, even while the contacts are kept closed or opened. In recent years, accordingly, various kinds of vacuum pressure monitoring devices for vacuum interrupters have been put into practical use. These vacuum pressure monitoring devices, however, have the following aspects and disadvantages in practical use: (1) There exists a vacuum pressure measuring device having an additional pair of electric discharge electrodes in the evacuated envelope; a high voltage is independently applied to the electric discharge electrodes by a separate high-voltage power supply to check the change in electric discharge phenomenon caused in accordance with Paschen's law (because vacuum pressure exerts an influence upon the phenomenon of electric discharge). In such a device, the structure of the vacuum interrupter is complicated and the manufacturing cost is relatively high, because an additional high-voltage power supply is necessary. (2) Another vacuum interrupter pressure measuring method involves disconnecting the interrupter from a power circuit and spacing movable and fixed contacts thereof so that an electric discharge is readily generated in accordance with Paschen's law; then a high voltage is applied to the spaced contacts from a separate high voltage power supply, to check the state of electric discharge. In such a method, the power circuit or the power supply must be disconnnected from the vacuum interrupter; thus, it is impossible to check the vacuum pressure while a high voltage is applied to the interrupter (i.e., under hot-line conditions) whereby the method is very time consuming and requires troublesome labor.

SUMMARY OF THE INVENTION

With these problems in mind, therefore, it is the primary object of the present invention to provide a relatively low cost and easily used vacuum monitor which can easily check for inadequate vacuum pressure within a vacuum interrupter, without need of any additional electric discharge electrodes or high voltage power supply, while a supply voltage is being applied to a power circuit via a vacuum interrupter.

To achieve the above-mentioned object, the vacuum monitor for a vacuum interrupter according to the present invention comprises an antenna disposed near a conductive material of the vacuum interrupter for receiving electromagnetic wave signals generated by electric discharge caused in accordance with a prebreakdown voltage depending upon Pashcen's law when vacuum pressure increases within the vacuum interrupter and a detection section connected to the antenna for electrically processing the electromagnetic wave signals received by the antenna in order to indicate poor vacuum pressure within a vacuum interrupter.

When the fixed and movable contacts are open circuited, the above-mentioned electric discharge is mainly generated between the two contacts; however, when the two contacts are closed, the above-mentioned electric discharge is generated between the fixed and movable contact rods including the two contacts and the main shield. In both cases, the electric discharge caused in accordance with a prebreakdown voltage depending upon Paschen's law is quite different from so-called partial discharge (i.e., corona discharge).

BRIEF DESCRIPTION OF THE DRAWINGS

The features and advantages of the vacuum monitor for a vacuum interrupter according to the present invention over the prior art vacuum measuring devices or method will be more clearly appreciated from the following description of the preferred embodiments of the invention taken in conjunction with the accompanying drawings in which like reference numerals designate the same or similar elements or sections throughout the figures thereof and in which;

FIG. 3 is a schematic block diagram of a vacuum monitor for a vacuum interrupter according to the present invention shown in FIG. 1;

FIG. 4(A) is a graphical representation of a 50 Hz voltage wave-form developed across the fixed and movable contacts of a vacuum interrupter, having abnormal vacuum pressure;

FIG. 4(B) is a graphical representation of a 50 Hz voltage wave-form received by an antenna attached to the vacuum monitor according to the present invention, when the vacuum pressure within the interrupter is normal;

FIG. 5(A) is a graphical representation of a 50 Hz voltage wave-form developed across the fixed and movable contacts of a vacuum interrupter, having an abnormal vacuum pressure;

FIG. 5(B) is a graphical representation of a 50 Hz voltage wave-form received by an antenna attached to the vacuum monitor according to the present invention, when the vacuum pressure within the interrupter is abnormal;

FIG. 10 is a pictorial view of a second vacuum switch gear including a vacuum interrupter therein and the vacuum monitor according to the present invention.

DETAILED DESCRIPTION OF THE PREFERRED EMBODIMENTS

In view of the above description, reference is now made to a first embodiment of the vacuum monitor for a vacuum interrupter according to the present invention.

Figure 1:
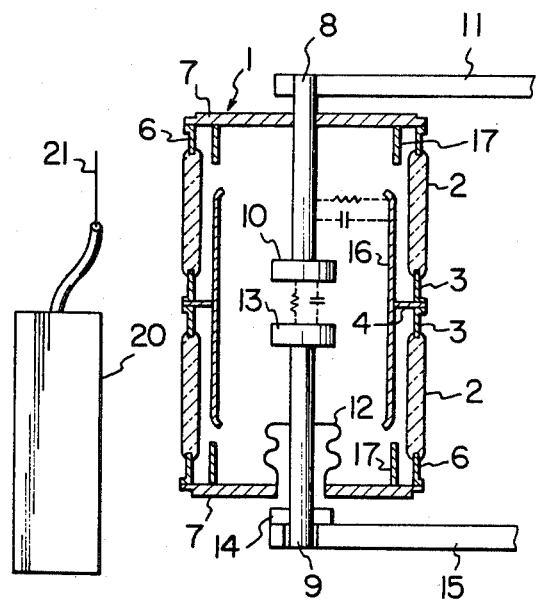
FIG. 1 is a longitudinal cross-sectional view of a vacuum interrupter in accordance with a first embodiment of the vacuum monitor according to the present invention, in which the fixed and movable contacts are open circuited.

In FIG. 1, there is illustrated a typical vacuum interrupter 1, having an evacuated envelope comprising two tubular insulating housings 2 made of glass or ceramics and hermetically joined to each other by two metallic tubes 3 with a disk 4 sandwiched therebetween. A pair of metallic end caps 7 are hermetically joined to the tubular insulating housing 2, respectively, with a metallic tube 6 joined hermetically on opposite sides (upper and lower sides) of the insulating housing 2. At the center of the respective end caps 7, are disposed two conductive contact rods 8 and 9. The fixed conductive contact rod 8 is hermetically joined at its upper end to the upper metallic end cap 7. A fixed contact 10 is fixedly brazed to the lower end of the fixed conductive contact rod 8 and an external connection conductor 11 is joined to the upper end of the fixed conductive contact rod 8. The movable conductive contact rod 9 is movably joined to the lower end cap 7 through a metal bellows 12 so as to be freely movable in the axial direction of the envelope without destroying a vacuum within the envelope. A movable contact 13 is fixedly brazed to the upper end of the movable conductive contact rod 9, and a slide contact 14 is slidably fitted to the lower end of the movable contact rod 9. Another external connection conductor 15 carries the slide contact 14. Therefore, even when the movable contact rod 9 moves up and down (an operating apparatus is not shown), the rod 9 is electrically connected to the external connection conductor 15 via the slide contact 14. Tubular main shield 16 disposed at the intermediate portion of the envelope prevents metal vapor, generated from the fixed and movable contacts 10 and 13 when they are opened or closed, from being deposited on the inner surfaces of the tubular insulating housings 2. Upper and lower auxiliary shields 17 extend from caps 7 into the interrupter interior. Further, in FIG. 1, when a high supply voltage is connected to the external conductor 11, a power circuit is connected to the other external conductor 15.

The vacuum interrupter 1 is operated by driving the movable contact 13 up and down to close and open an electric power circuit connected thereto. When the two contacts are closed, current flows from the upper external connection conductor 11 to the lower external connection conductor 15 or vice versa, through the path of the fixed contact rod 8, the fixed contact 10, the movable contact 13 and the movable contact rod 9.

Power circuit is interrupted by driving the movable contact 13 downward so it is separated from the fixed contact 10 by an appropriate operating apparatus (not shown).

Further, in FIG. 1, a vacuum monitor 20, having an antenna 21, according to the present invention (described in more detail later) is disposed near the vacuum interrupter 1 for detecting poor vacuum pressure in the interrupter envelope.

Figure 2A:
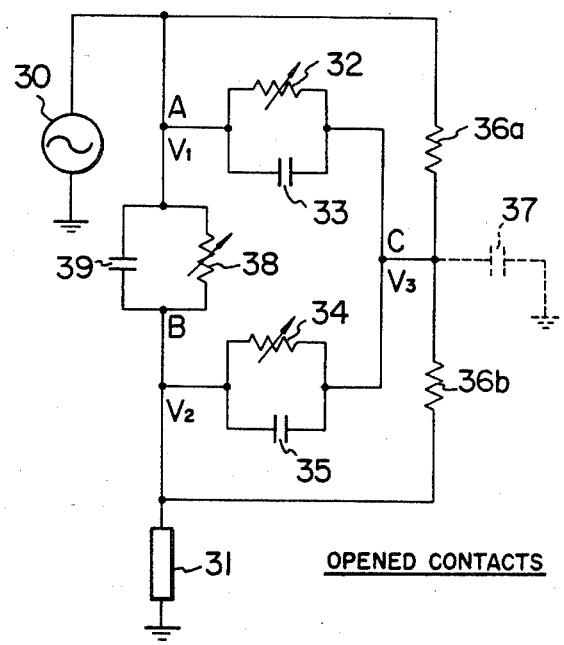
FIG. 2(A) is an equivalent circuit diagram of the vacuum interrupter shown in FIG. 1, in which the two contacts thereof are open circuited.
Figure 2B:
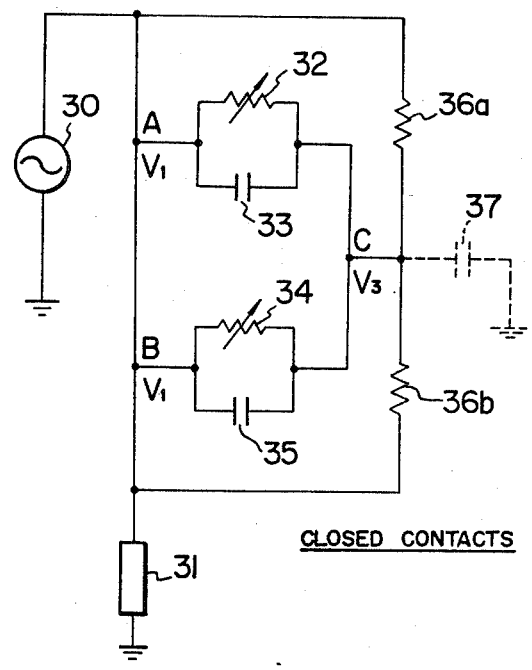
FIG. 2(B) is an equivalent circuit diagram of the vacuum interrupter shown in FIG. 1, in which the two contacts thereof are closed.

FIG. 2(A) is an equivalent circuit diagram of the vacuum interrupter shown in FIG. 1, when the two contacts thereof are open circuited. FIG. 2(B) is the same circuit diagram, when the two contacts thereof are closed. Load 31 is normally supplied with current from power supply 30 that is a part of a power circuit to be interrupted by a vacuum interrupter. Between the fixed contact 10 including the fixed contact rod 8 and the main shield 16 are parallel insulation resistance 32 and stray capacitance 33. Between the movable contact 13 including the movable contact rod 9 and the main shield 16 are parallel insulation resistance 34 and stray capacitance 35. The two tubular insulating housings 2 respectively include series insulation resistance 36a and 36b while a stray capacitance 37 subsists between the main shield 16 and the ground. Parallel insulation resistance 38 and stray capacitance 39 subsist between contacts 10 and 13, while the contacts are open.

In FIG. 2(A), insulation resistances 32, 34 and 38 are represented as variable resistors, while in FIG. 2(B), resistors 32 and 34 are so indicated. All other components in FIGS. 2(A) and 2(B) are considered to be fixed. The reason is as follows: since the dielectric constant in a vacuum in almost the same as that in the air, the stray capacitances 33, 35, 37, and 39 do not change even when the vacuum pressure within the vacuum interrupter deteriorates, that is, increases. On the other hand, the insulation resistances 32, 34, and 38 change in accordance with a prebreakdown voltage depending upon Paschen's law when the vacuum pressure deteriorates. Generally, Paschen's law indicates that breakdown voltage in a vacuum decreases as the product of vacuum pressure (Torr) and contact gap distance (mm) increases. The breakdown voltage decreases to a certain inflection point and then increases after exceeding the inflection point as the product increases.

In FIG. 2(a), assume that the potentials at junction points A and B are $V_1$ and $V_2$, respectively, and that the floating potential at junction point C is $V_3$ whereby the potential differences $(V_1-V_2)$, $(V_1-V_3)$ and $(V_2-V_3)$ between A and B, A and C, and B and C change according to the changing values of the variable resistors, 38, 32, and 34, respectively; that is, the potential differences change with changes of vacuum pressure in the envelope shown in FIG. 1. In more detail, when the vacuum pressure in the interrupter is normal, i.e., less than $10^{-4}$ Torr, the respective potential differences are constant. However, in case the vacuum pressure increases gradually due to air leakage or outgassing, whereby ions are produced in the envelope, the insulation resistances 32, 34 and 38 decrease. This causes unusual electric dark current to flow mainly between the fixed and movable contacts 10 and 13 when the two contacts are open. The unusual dark current flows between the fixed and movable contact rods 8 and 9 including the two contacts and the main shield 16 when contacts 10 and 13 are closed.

As the insulation resistances 38, 32 or 34 drop gradually over a long time (e.g., 2 to 3 years) the unusual electric dark current flows through the space associated with them, causing a kind of unusual electromagnetic wave to be emitted. Since the electromagnetic wave generated by the above-mentioned potential difference (between points A and B or between points A and C or between points B and C) tends to propagate in conductive material connected to the vacuum interrupter and to be emitted therefrom, it is possible to indirectly check poor vacuum pressure in the vacuum interrupter by placing an antenna near a conductive material of the interrupter to detect the electromagnetic wave signals generated by the unusual electric dark discharge when the vacuum pressure increases in the vacuum interrupter.

Further, in the above description, it is obvious that the potential $V_1$ is equal to the potential $V_2$ when contacts 10 and 13 are closed and the floating potential $V_3$ changes according to the stray capacitance 37 which is usually determined by the grounded condition.

It should be noted that the above-mentioned electric discharge is quite different from so-called partial discharge or corona discharge which is caused by uneven electric field and results in local insulation destruction.

FIG. 3 is a schematic block diagram of a preferred embodiment of vacuum monitor 20, FIG. 1. The vacuum monitor 20 comprises an antenna 21, an antenna cable 22, and a detection section including a buffer amplifier 23, a band-pass filter 24, an amplifier 25, a first amplitude comparator 26, an integrator or a counter 27 and a second amplitude comparator 28. The antenna 21 detects the electromagnetic wave signals existing near a conductive material of a vacuum interrupter. High input impedance buffer amplifier 23 amplifies the signal received by the antenna 21 and derives the signal $S_1$ as shown in FIG. 3. The frequency components of signal $S_1$ indicate that the electromagnetic wave signals are superimposed as ripples on a commercial frequency of, for instance, 50 or 60 Hz. The band-pass filter 24 passes only the 2 to 20 KHz frequency components of signal $S_1$ (the commercial frequency components are, of course, eliminated) and derives signal $S_2$. Thus, band-pass filter 24 eliminates frequency components less than 2 KHz from the signal $S_1$. It is necessary to remove components having frequencies less than 2 KHz because rotary machines, transformers, power measurement instruments, et cetera often generate signals including higher harmonics of 2 KHz or less. The amplifier 25 amplifies the filtered signal $S_2$ to the corresponding signal $S_3$. The first comparator 26 compares this amplified signal $S_3$ with a predetermined reference voltage level and derives a signal $S_4$ whenever the amplified signal $S_3$ exceeds the reference level. The integrator (or a counter) 27 continually integrates or counts the number of cycles of the signal $S_4$ and derives the corresponding signal $S_5$. The second comparator 28 compares the integrated or counted signal $S_5$ with another predetermined reference value and derives a signal $S_6$ when the signal $S_5$ exceeds the reference level. This signal $S_6$, as derived from the second comparator 28, is used for producing an alarm or for activating an indicator to show inadequate vacuum pressure or that vacuum pressure is abnormally increasing within the interrupter.

The above-mentioned vacuum monitor 20 can be used by fixedly installing it (as a fixed-type vacuum monitor) or by moving it (as a portable-type vacuum monitor) toward a vacuum interrupter. In both the cases the buffer amplifier 23 is generally disconnected electrically from the band-pass filter 24 and is connected optically to the filter by using an appropriate optical signal transmitting means such as a light emitting diode, a phototransistor, optical fibers, et cetera. This arrangement is particularly desirable in a portable monitor, since it is very dangerous for all the monitoring elements to be connected electrically. If the band-pass filter 24 is electrically connected to buffer amplifier 23, a high-voltage electric shock could be applied to the human body if the antenna contacted the external connection conductor.

Further, when used as a portable-type vacuum monitor, the antenna portion is electrically separated from the detection section by an insulating rod. In more detail, on top of the insulating rod there are mounted the antenna and an E-O (electrooptical) converter. Received electromagnetic wave signals are supplied through an optical fiber to the detection section mounted on the bottom side of the rod to prevent electric shock. Further, in monitoring vacuum pressure, only the antenna is brought near the vacuum interrupter to be monitored.

The wave-forms of the electromagnetic wave signals received by the antenna attached to the vacuum monitor according to the present invention are described with reference to FIGS. 4 and 5.

FIGS. 4(A) and 4(B) are respectively illustrations of the wave-forms of the voltage signals developed across contacts 10 and 13 and received by antenna 21 when the vacuum pressure within the vaccum interrupter is normal (e.g., $10^{-4}$ Torr or less). Thus, under normal vacuum pressure the voltage wave-form across contacts 10 and 13 is a sine wave of a commercial frequency (e.g., 50 or 60 Hz) and the signal received by the antenna 21 is roughly a sine wave having superimposed harmonics up to 2 KHz. These superimposed harmonics may be generated by rotary machines, transformers, measuring devices, et cetera installed near the vacuum interrupter or in or near the electric power circuit to which the vacuum interrupter is connected. As already described, since a band-pass filter 24 is provided for the vacuum monitor, these signals with frequencies of 2 KHz or less can be eliminated. Further, by connecting a certain capacitor to the input terminal of the buffer amplifier 23, commercial frequency components of 50 or 60 Hz can easily be eliminated. That is to say, when the vacuum pressure within the vacuum interrupter is normal, the vacuum monitor derives no output signal.

In FIGS. 5(A) and 5(B) are illustrated the wave-forms of the voltage signal developing across contacts 10 and 13 and the electromagnetic wave signal received by antenna 21 when the vacuum pressure is abnormal (e.g., $10^{-3}$ Torr or more). These figures indicate that under abnormal vacuum pressure the voltage wave-form across contacts 10 and 13 is roughly a square wave, the phase thereof being a little delayed, and the voltage wave-form of the electromagnetic wave signal received by the antenna has an unusual, peculiar shape containing ripples including relatively-high frequency components of 2 KHz or more superimposed on a sine wave.

The wave-forms of FIGS. 5(A) and 5(B) are derived because once electric discharge begins within the vacuum interrupter, the voltage across contacts 10 and 13 cannot rise to the peak value as shown in FIG. 4(A), but are clipped at a certain voltage level. Further, whenever the voltage across the contacts 10 and 13 rises sharply, the ripple is generated. The reason why the signal of such a wave-form as described above is received by the antenna when electric discharge begins under abnormal vacuum pressure has not yet been completely analyzed. However, it is true that the signal as described above can be received by the antenna whenever the vacuum pressure within the vacuum interrupter increases abnormally, and the frequency components of the electromagnetic wave signal lie between 2 to 20 KHz, which is higher than those generated by machines or devices other than the vacuum interrupter.

Therefore, by detecting the electromagnetic wave ripple signals superimposed on the sine wave, it is possible to check the generation of electric discharge within the interrupter due to poor vacuum pressure. Furthermore, even if a partial discharge is generated by other devices, since the wave-form thereof is quite different from that of the electromagnetic wave signal generated by the dark current discharge and the frequency components thereof are generally lower than those of the electromagnetic wave signal, there is no harmful influence on the detection characteristics of the vacuum monitor.

There will be described hereinbelow the experimental results of the vacuum interrupter and the vacuum monitor according to the present invention.

In the case where the vacuum pressure within a vacuum interrupter changes within the range of $5 \times 10^{-3}$ to 300 Torr, the frequency components of the electromagnetic wave signals received by the antenna ranges from 10 to 14 KHz when the electrostatic capacitance between the load and the ground is 0.0042 $\mu$F, from 2 to 8 KHz when the capacitance is 0.05 $\mu$F, and from 2 to 20 KHz when the capacitance is 0.2 $\mu$F or more. Further, when the capacitance is 0.0042 $\mu$F or less, experiments have indicated that the detection sensitivity becomes unstable. Hence, the detection sensitivity can be improved by connecting a capacitance of about 0.2 $\mu$F on the load side of the vacuum interrupter, to stably detect the electromagnetic wave signals caused by abnormally poor vacuum pressure.

Further, in the case where a vinyl-coated copper cable antenna with a length of 30 cm and a cross-sectional area of 1.25 mm$^2$ is placed 1 m away from an open circuited 6.9 kV-class vacuum interrupter having a vacuum pressure of approximately $10^{-1}$ Torr, and a voltage of $6.9/\sqrt{3} \doteq 4$ kV applied by a 0.2 $\mu$F capacitor connected between the load-side conductor and the ground, the detected signal voltage derived from the amplifier 25 having a gain of $10^4$ is about 0.6 V. Under almost the same experimental conditions, when contacts 10 and 13 are closed, the detected signal voltage derived from the amplifier 25 is about 0.3 V.

The reason why the detected signal voltage is low when contacts 10 and 13 are closed, in comparison with the voltage derived when the contacts are open, may be due to the following fact: when the contacts are closed, an electric discharge is generated only between the fixed and movable contact rods 8 and 9 and the main shield 16. This may cause the parallel insulation resistances 32 and 34 between the rods and shield 16 to be greater than the insulation resistance 38 between open circuited contacts 10 and 13. Therefore the electric discharge energy obtained when two contacts 10 and 13 are closed may be smaller than that obtained when the contacts are open.

Figure 6:
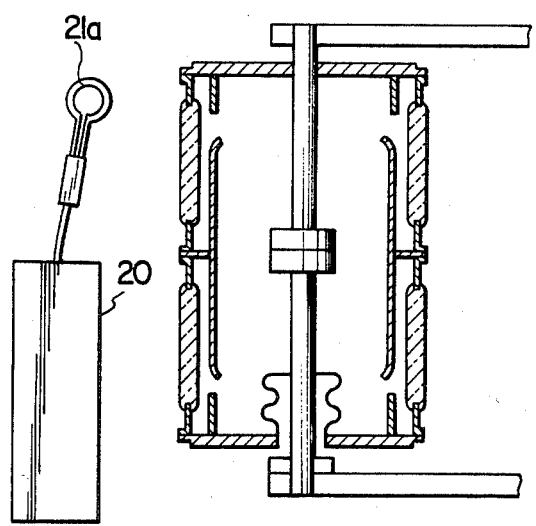
FIG. 6 is a longitudinal cross-sectional view of a vacuum interrupter in accordance with a second embodiment of the vacuum monitor according to the present invention, having closed fixed and movable contact.

FIG. 6 is a diagram of a second embodiment of the vacuum monitor according to the present invention. In this embodiment a loop antenna 21a is provided for the vacuum monitor in place of a rod antenna 21 shown in FIG. 1. The equivalent length of this loop antenna 21a is almost the same as that of the rod antenna 21. Thus, the diameter of loop antenna 21a is about 10 cm and the straight portion thereof is about 5 cm. When the loop antenna 21a having the above-mentioned dimensions is placed near a vacuum interrupter under the same experimental conditions as described supra, it is possible to detect poor vaccum pressure in the same way as already described hereinabove. Further, in FIG. 6 is shown a vacuum interrupter having closed contacts to clearly illustrate that it is also possible to detect poor vacuum pressure even when the contacts are closed and when a high voltage is applied to a power circuit through a vacuum interrupter; in other words, under hot-line condition.

The description has been made hereinabove of the case where the vacuum monitor according to the present invention is disposed near a bare vacuum interrupter in order to detect vacuum pressure deterioration. However, ultra-high-voltage class vacuum interrupters (e.g., 66 kV or more) are usually housed in a tank filled with an insulating medium such as insulation oil or gas.

Figure 7:
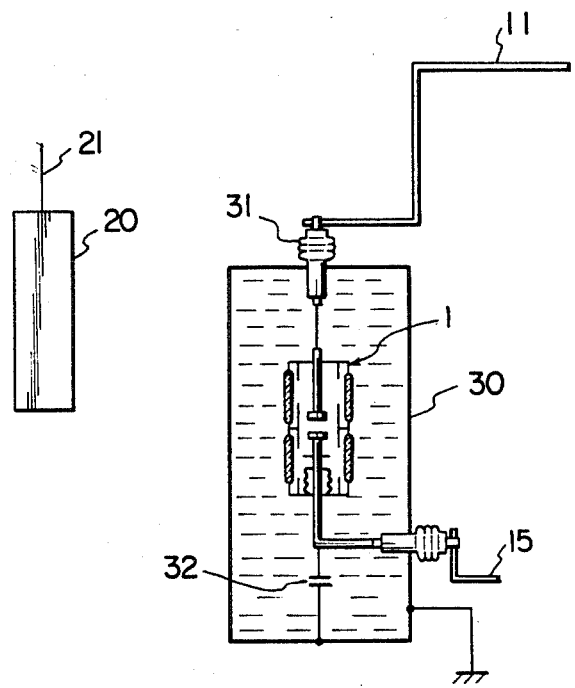
FIG. 7 is a longitudinal cross-sectional view of a first vacuum circuit breaker including a vacuum interrupter and an operating apparatus (not shown) therein and the vacuum monitor according to the present invention.

FIG. 7 is an exemplary illustration of an ultra-high-voltage vacuum interrupter including tank 30 filled with an insulating medium; the tank is made of metal plate, such as iron or stainless steel plates. External conductors 11 and 15 connected to the fixed contact rod pass through porcelain bushing 31. Capacitor 32 is connected between the movable contact side conductor and tank 30 to increase detection sensitivity when the contacts are closed.

In such cases, it is preferable to place the antenna 21 of the vacuum monitor 20 near the porcelain bushing 31. This is because the vacuum interrupter is housed in a grounded tank.

In the case where a vinyl-coated upper cable antenna with a length of 30 cm and a cross-sectional area of 1.25 mm$^2$ is placed 1 m away from the porcelain bushing of a 0.3 Torr, 6.0 kV-class vacuum open circuit interrupter housed in a tank filled with insulating oil, and a voltage of $6.9/\sqrt{3} \doteq 4$ kV is applied to the interrupter by a 0.25 $\mu$F capacitor connected between the load-side conductor and the tank (grounded), the detected output signal voltage of $10^4$ gain amplifier 25 is about 0.4 V. Further, in this case, the capacitance of 0.25 $\mu$F corresponds to that obtained when a 1 km-long 6.9 kV-class cable is laid.

This 0.25 $\mu$F capacitor 32 is effective especially when vacuum pressure is required to check the pressure state when the two contacts are closed. This is because the field strength of the electromagnetic wave signals caused by the electric discharge between two contact rods including the two contacts and the main shield is relatively weak.

Figure 8:
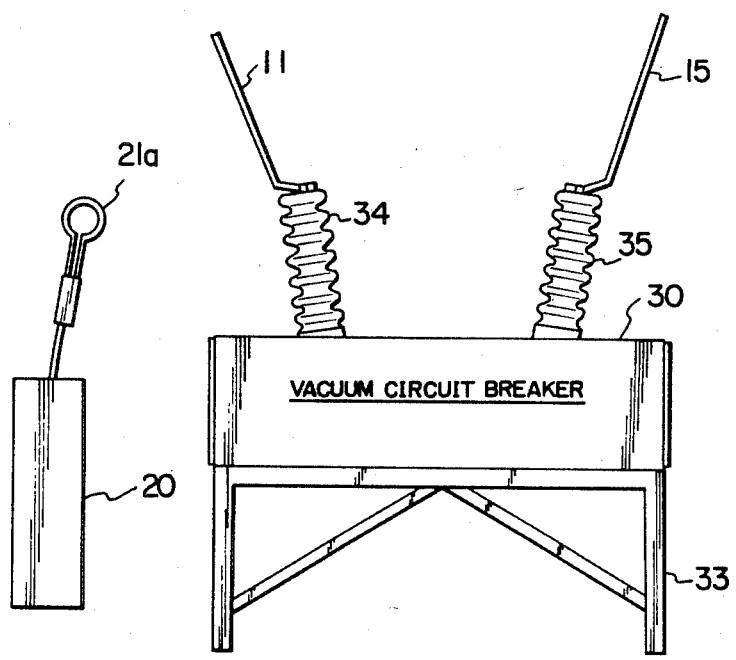
FIG. 8 is a pictorial view of a second vacuum circuit breaker including a vacuum interrupter therein and the vacuum monitor according to the present invention.

FIG. 8 is a diagram of an exemplary structure for detecting poor vacuum pressure in a vacuum interrupter housed in a tank 30 together with other operating devices. The vacuum interrupter incorporated with other operating devices, such as a motor, is called a vacuum circuit breaker herein. In FIG. 8, the tank 30 is mounted on a stand frame 33. First and second porcelain bushings 34 and 35 insulate tank 30 from a first external connection conductor 11 to which a power supply is connected, and from a second external connection conductor 15 to which a load is connected. In this case, it is preferable to place the antenna 21 or 21a of the vacuum monitor 20 near the first porcelain bushing 34.

Figure 9:
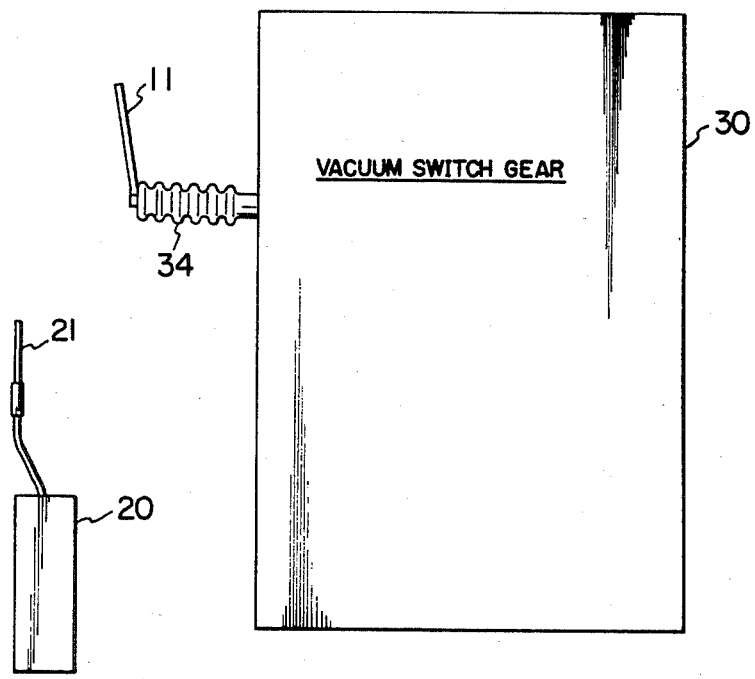
FIG. 9 is a pictorial view of a first vacuum switch gear including a vacuum interrupter therein and the vacuum monitor according to the present invention.

FIG. 9 is a diagram of an exemplary structure for detecting poor vaccum pressure in a vacuum interrupter housed in a tank 30, that is, within a single-phase vacuum switch gear. In FIG. 9, a porcelain bushing 34 insulates tank 30 from an external connection conductor 11 to which a power supply is connected. In this case, the antenna 21 or 21a of the vacuum monitor 20 is placed near the porcelain bushing 34.

FIG. 10 is a diagram of an exemplary structure for detecting poor vacuum pressure in a vacuum interrupter housed in a tank 30 of a vacuum switch gear containing various commonly housed power elements or devices. In FIG. 10, a three-phase external terminal 36 is provided for connecting external devices thereto. In this case, the antenna 21 or 21a of the vacuum monitor 20 is placed near the three-phase terminal 36 attached to the outside surface of the tank 30.

Conventionally, complicated steps have been required for checking the vacuum pressure within a vacuum interrupter housed within a tank filled with an insulating oil or gas as follows: First, the insulating oil or gas is removed from the tank; secondly, the contact gap between the fixed and the movable contacts is adjusted to have an appropriate spacing suitable for dielectric strength test in accordance with Paschen's law; thirdly, a high voltage is applied to the contact gap in accordance with a method of voltage-withstand test; fourthly, the contact gap of the checked vacuum interrupter is returned to its original spacing; lastly, the interrupter is placed in a tank and an insulating oil or gas is filled therein. Accordingly, it takes much time and labor to check the vacuum pressure and there inevitably is a different contact gap spacing before and after the vacuum pressure is checked; that is, it is very difficult to return the contacts to the original gap condition. In this invention, however, since there is no need for such complicated test procedures as described above and no need to provide any additional parts or elements or a separate high-voltage power supply, it is possible to check the deterioration of vacuum pressure easily and accurately at a low cost.

The vacuum monitor according to the present invention is applicable to almost all the ordinary vacuum interrupters now in use, excluding those that are perfectly ground-shielded. The monitor of the invention can advantageously check the vacuum pressure while a voltage is applied to the interrupter, that is, under hot-line condition. Further, since a commercial domestic power supply (100 to 200 V) or battery cells can be used as the power supply for the monitor, it is possible to realize a small-sized, light-weight portable-type vacuum monitor. Furthermore, the greater the contact spacing, the higher the detection sensitivity of the monitor. This is because the electric dark discharge is generated at a lower voltage in dependence upon Paschen's law. Therefore, it is possible to check vacuum pressure within a range as wide as $10^{-3}$ to 100 Torr.

Since the vacuum pressure within a vacuum interrupter can be checked by the invention in response to electromagnetic wave signals generated by an electric discharge existing between the two contacts in the case when the two contacts are open or between the two contact rods including the contacts and the main shield in the case when the two contacts are closed in accordance with a prebreakdown voltage depending upon Paschen's law, and transduced by an antenna placed near the conductive material of the interrupter and since the antenna-received signal including only higher harmonics of 2 to 20 KHz is amplified and compared with a predetermined reference value to derive an alarm signal, it is possible to realize a very convenient, low-priced, small-sized vacuum monitor for a vacuum interrupter.

It will be understood by those skilled in the art that the foregoing description is in terms of a preferred embodiment of the present invention wherein various changes and modifications may be made without departing from the spirit and scope of the invention, as set forth in the appended claims.

What is claimed is:

1. In a vacuum monitor for a vacuum interrupter, the interrupter including a fixed and a movable rod, to which rods a fixed and a movable contact are respectively joined, and also including a main shield within a tubular insulation housing, said vacuum monitor comprising a detection section for indicating when a vacuum pressure within the vacuum interrupter is above a predetermined level, the improvement wherein the monitor comprises an antenna disposed near a conductive material of the vacuum interrupter, said antenna being designed for receiving, when an alternating voltage of a commercial frequency is applied across the rods, electromagnetic wave signals composed of any superimposed electromagnetic signals including higher frequency components of 2 KHz or more, and wherein said detection section is connected to said antenna for electrically processing the electromagnetic wave signals received by said antenna, said detection section comprising a band-pass filter passing only the frequency components of the electromagnetic wave signals of 2 to 20 KHz which are generated by an electric discharge when the vacuum pressure increases within the vacuum interrupter above the predetermined level.

2. A vacuum monitor for a vacuum interrupter as set forth in claim 1, wherein said antenna receives the electromagnetic wave signals generated by the electric discharge existing between the fixed and movable contacts in accordance with a prebreakdown voltage depending upon Paschen's law when the two contacts are kept open and when the vacuum pressure within the vacuum interrupter increases.

3. A vacuum monitor for a vacuum interrupter as set forth in claim 1, wherein said antenna receives electromagnetic wave signals generated by the electric discharge existing between the fixed and movable rods including the fixed and movable contacts and the main shield in accordance with a prebreakdown voltage depending upon Paschen's law when the two contacts are kept closed and when the vacuum pressure within the vacuum interrupter rises.

4. A vacuum monitor for a vacuum interrupter as set forth in claim 1, wherein said antenna is disposed near an external conductive material connected to the vacuum interrupter housed within a metal tank filled with an insulating medium, a capacitor being connected between a load side conductive material of the vacuum interrupter and ground to increase the detection sensitivity for the electromagnetic wave signals.

5. A vacuum monitor for a vacuum interrupter as set forth in claim 4, wherein said external conductive material passes through a porcelain bushing attached to the metal tank within which a vacuum circuit breaker including the vacuum interrupter is housed.

6. A vacuum monitor for a vacuum interrupter as set forth in claim 4, wherein said external conductive material is a three-phase external terminal attached to the metal tank within which a switch gear including a vacuum circuit breaker with the vacuum interrupter is housed.

7. A vacuum monitor for a vacuum interrupter as set forth in claim 4, wherein a capacitance of the capacitor connected between the load size conductive material of the vacuum interrupter and the metal tank is approximately 0.2 $\mu$F.

8. A vacuum monitor for a vacuum interrupter as set forth in claim 1, wherein said antenna is a rod antenna.

9. A vacuum monitor for a vacuum interrupter as set forth in claim 1, wherein said antenna is a loop antenna.

10. A vacuum monitor for a vacuum interrupter as set forth in claim 1, wherein said detection section further comprises:
   (a) a first comparator connected to the bandpass filter for comparing a voltage level of the detected electromagnetic wave signals with a predetermined reference voltage level and deriving signals when the voltage level of the detected electromagnetic wave signals exceeds the reference level;
   (b) a counter connected to said first comparator for counting a number of the electromagnetic wave signals exceeding the reference level; and
   (c) a second comparator connected to said counter for comparing the number counted by said counter with a predetermined reference number and deriving a signal when the counted number exceeds the reference number to indicate that the vacuum pressure within the vacuum interrupter is above the predetermined level.

11. A vacuum monitor for a vacuum interrupter as set forth in claim 1, wherein said antenna is fixedly disposed near the conductive material.

12. A vacuum monitor for a vacuum interrupter as set forth in claim 1, wherein said antenna is movably disposed near the conductive material.

13. A vacuum monitor for a vacuum interrupter as set forth in claim 4, wherein the insulating medium is an insulating oil.

14. A vacuum monitor for a vacuum interrupter as set forth in claim 4, wherein the insulating medium is an insulating gas.

15. A method of detecting whether a vacuum interrupter connected to a power source has an abnormally high pressure environment, the vacuum interrupter being connected to the power source so components thereof have differing potentials, the difference in potential and the abnormally high pressure causing radio waves having a predetermined characteristic to be emitted by the interrupter, the predetermined characteristic not being emitted while the interrupter has normal vacuum pressure, the method comprising the step of detecting the predetermined characteristic of the emitted radio waves.

16. The method of claim 15 wherein the difference in potential and the normal vacuum pressure cause radio waves having another characteristic to be emitted by the interrupter, the detecting step including distinguishing the predetermined characteristic from the another characteristic.

17. The method of claim 16 wherein the another characteristic includes frequency components of the power source, the predetermined characteristic including frequency components higher than detectable harmonics of the power source, the detecting step including detecting the frequency components higher than the detectable harmonics of the power source to the exclusion of the frequency components and the detectable harmonics of the power source.

18. In combination, a vacuum interrupter adapted to be connected to a power source, the vacuum interrupter including components adapted to be connected to the power source so as to be maintained at different potentials while the interrupter is connected to the source, the potential difference and the normal vacuum of the interrupter causing radio waves having a first characteristic to be emitted by the interrupter, the potential difference and an abnormally high pressure of the interrupter causing radio waves having a second characteristic to be emitted by the interrupter;
   a radio wave receiver including: means for transducing the emitted radio waves into an electric signal, means responsive to the transduced electric signal for detecting the second characteristic to the exclusion of the first characteristic to indicate the abnormal pressure.

19. The combination of claim 18 wherein the second characteristic includes frequency components higher than a frequency of the power source and detectable harmonics thereof, the first characteristic including the frequency of the power source.

20. The combination of claim 19 wherein the transducing means includes means for deriving an electric signal having said first and second characteristics, said means for detecting including means for passing the second characteristic to the exclusion of the first characteristic and the detectable harmonics of the power source.

21. The combination of claim 18 wherein the transducing means includes means for deriving an electric signal having said first and second characteristics, said means for detecting including means for passing the second characteristic to the exclusion of the first characteristic.

22. The method of claim 16 wherein the waves having the predetermined and another characteristics are derived while contacts of the interrupter are connected to the same power source.

23. The method of claim 16 wherein the waves having the predetermined and another characteristics are derived while contacts of the interrupter are connected to the same power source and are either open circuited or closed.

* * * * *